United States Patent [19]
Miyata

[11] Patent Number: 5,148,138
[45] Date of Patent: Sep. 15, 1992

[54] CYLINDRICAL MAGNET APPARATUS SUITABLE FOR NMR IMAGING

[75] Inventor: Koji Miyata, Fukui, Japan

[73] Assignee: Shin-Etsu Chemical Co., Ltd., Tokyo, Japan

[21] Appl. No.: 771,102

[22] Filed: Oct. 4, 1991

[30] Foreign Application Priority Data

Oct. 4, 1990 [JP] Japan ................................ 2-267446
Oct. 4, 1990 [JP] Japan ................................ 2-267447
Oct. 4, 1990 [JP] Japan ................................ 2-267448

[51] Int. Cl.$^5$ .............................................. H01F 7/02
[52] U.S. Cl. ..................................... 335/302; 335/306
[58] Field of Search ............... 335/296, 301, 302, 304, 335/306

[56] References Cited

U.S. PATENT DOCUMENTS 4,675,609 6/1987 Danby .................................. 335/306
4,777,464 10/1988 Takabatashi ........................ 335/306

Primary Examiner—Leo P. Picard
Assistant Examiner—Ramon M. Barrera
Attorney, Agent, or Firm—Sughrue, Mion, Zinn, Macpeak & Seas

[57] ABSTRACT

The invention relates to a cylindrical magnet apparatus for producing a uniform magnetic field in a predetermined direction within the cylindrical hole in the apparatus. The apparatus is suitable for use in NMR imaging. Essentially the apparatus is an assembly of a plurality of dipole ring magnets in a coaxially juxtaposed arrangement. Each ring magnet is constructed of a plurality of cross-sectionally trapezoidal segments which are arranged annularly, and each segment is an anisotropic magnet block magnetized in a suitable direction. To acquire a good balance between the material cost and the gross weight of the apparatus a selected portion of the assembly of dipole ring magnets is made of a rare earth alloy magnet, whereas the remaining portion is made of a ferrite magnet. In one embodiment of the invention, in each segment of each ring magnet an end part on the radially inner side of the ring magnet is made of a rare earth alloy magnet whereas the remaining part is made of a ferrite magnet.

21 Claims, 4 Drawing Sheets

CYLINDRICAL MAGNET APPARATUS SUITABLE FOR NMR IMAGING

BACKGROUND OF THE INVENTION

This invention relates to a cylindrical magnet apparatus for producing a magnetic field in a predetermined direction within the cylindrical bore of the apparatus. Essentially the apparatus is a coaxial assembly of a plurality of dipole ring magnets, and each ring magnet is constructed of a plurality of annularly arranged segments each of which is an anisotropic magnet block. The apparatus is suitable for use in nuclear magnetic resonance (NMR) imaging, and particularly in computerized tomography (CT) apparatus utilizing NMR.

In NMR-CT apparatus the resolution of obtained images depends significantly on the uniformity of the magnetic field in the apparatus. To produce a uniform magnetic field in a sufficiently wide region of a cylindrical space large enough to accomodate a major portion of the human body, it is known to use a plurality of coaxially arranged dipole ring magnets. Since it is impracticable to produce unitary ring magnets large enough for this purpose, it is necessary to divide each of the required dipole ring magnets into a plurality of segments. That is, each dipole ring magnet is formed by annularly assembling a plurality of anisotropic magnet blocks which are respectively magnetized in suitable directions.

As to the magnet material for the aforementioned dipole ring magnets either a conventional ferrite magnet or a rare earth alloy magnet is used. When a ferrite magnet is used the ring magnets need to be made very large in outer diameters so that the gross weight of the assembly of the ring magnets become very heavy. In the case of using a rare earth alloy metal it is possible to greatly reduce the total weight of the ring magnets, but nevertheless there arises a great increase in the material cost because of very high price of the rare earth alloy magnet per unit weight.

SUMMARY OF THE INVENTION

The present invention relates to a cylindrical magnet apparatus which is an assembly of a plurality of dipole ring magnets each of which is formed of a plurality of anisotropic magnet blocks and can be used in NMR-CT apparatus, and it is an object of the invention to provide an improved cylindrical magnet apparatus which is relatively light in the total weight of magnet and reasonably economical in magnet material cost.

The present invention provides a magnet apparatus suitable for use in NMR imaging, and particularly in NMR-CT apparatus. Essentially the magnet apparatus is an assembly of a plurality of dipole ring magnets having substantially the same inner diameter in a coaxially juxtaposed arrangement. Each of the dipole ring magnets is constructed of a plurality of segments which are arranged annularly, and each segment is an anisotropic magnet block which has a trapezoidal cross-sectional shape and is magnetized in a suitable direction before constructing the dipole ring magnet such that a magnetic field in a predetermined direction is produced in the hole of each dipole ring magnet. According to the invention a selected portion of the assembly of dipole ring magnets is made of a rare earth alloy magnet whereas the remaining portion of the assembly is made of a ferrite magnet.

In a preferred embodiment of the invention, in each segment of each dipole ring magnet an end part on the radially inner side of the ring magnet is made of a rare earth alloy magnet whereas the remaining part of the segment is made of a ferrite magnet.

In another preferred embodiment of the invention, in one ring magnet which is at one end of the cylindrical magnet apparatus and another dipole ring magnet which is at the opposite end of the magnet apparatus the plurality of segments are all made of a rare earth alloy magnet whereas in each of the remaining dipole ring magnet(s) the plurality of segments are all made of a ferrite magnet.

In a third preferred embodiment of the invention, in each dipole ring magnet only two segments in which the direction of magnetization is parallel to the predetermined direction of the magnetic field produced in the hole of each dipole ring magnet are made of a ferrite magnet whereas the remaining segments are made of a rare earth alloy magnet.

Thus, the present invention utilizes both a ferrite magnet, which is inexpensive despite the need of using a relatively large weight because of relatively low magnetic characteristics, and a rare earth alloy magnet which is expensive but is superior in magnetic characteristics and hence contributes to a reduction in the total weight of the magnet apparatus. By jointly using these two kinds of magnets so as to appropriately utilize the advantages of the respective magnets, the invention has succeeded in aquiring a good balance between the material cost and the gross weight of the assembly of a plurality of segmented dipole ring magnets.

DESCRIPTION OF THE PREFERRED EMBODIMENTS

Figure 1:
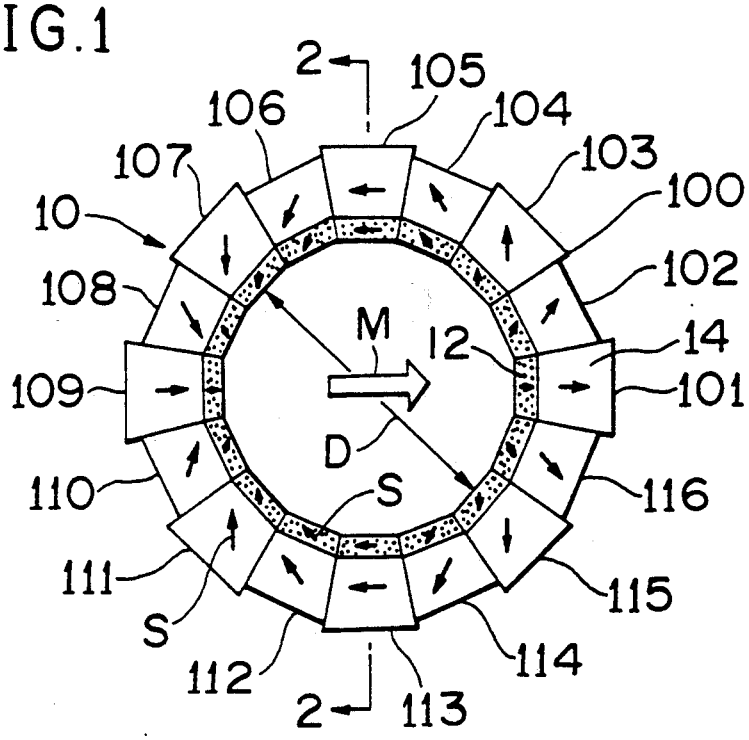
FIG. 1 is a front view of a magnet apparatus as an embodiment of the invention.
Figure 2:
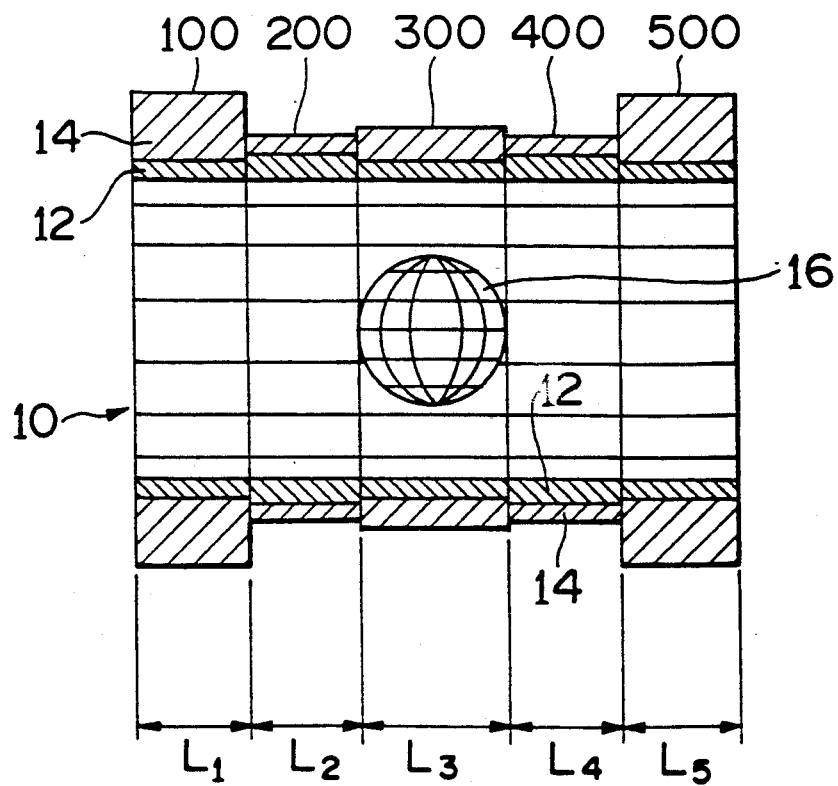
FIG. 2 is a sectional view taken along the line 2—2 in FIG. 1.

As a first embodiment of the invention FIGS. 1 and 2 show a magnetic field producing apparatus 10 which is an assembly of five dipole ring magnets 100, 200, 300, 400, 500 in a coaxially juxtaposed arrangement. The five ring magents have the same inner diameter so that the apparatus 10 has a cylindrical hole As shown in FIG. 1 the ring magnet 100 at one end of the apparatus 10 is constructed of sixteen segments 101, 102,..., 116 which are arranged annularly and bonded to each other. Each of these sixteen segments 101, 102,..., 116 is an anisotropic magnet block having a trapezoidal cross-sectional shape. In each segment 101, 102,..., 116 an end part on the radially inner side of the ring magnet 100 is made of a rare earth alloy magnet 12, and the remaining part on the radially outer side is made of a ferrite magnet 14. Before assembling the sixteen segments 101, 102,..., 116 into the ring magnet 100 the respective segments are magnetized in the directions indicated by arrows S such that the ring magnet 100 is magnetized in the direction indicated by arrow M.

In the same manner, each of the remaining four ring magnets 200, 300, 400, 500 is constructed of sixteen segments each of which is an anisotropic magnet block having a trapezoidal cross-sectional shape, and in every segment an end part on the radially inner side of the ring magnet is made of the rare earth alloy magnet 12 whereas the remaining part is made of the ferrite magnet 14. In every ring magnet the directions of magnetization of the respective segments are as indicated by arrows S in FIG. 1.

Referring to FIG. 2, with the apparatus 10 it is intended to produce a very uniform magnetic field particularly in a central region 16, which is assumed to be a nearly spherical region, of the bore of the cylindrical apparatus 10. For this purpose a radially inner part of the ring magnets 100, 200,..., 500 serves a more important role than the radially outer part Accordingly the rare earth alloy magnet 12, which is an expensive material, is used only for the radially inner part of each ring magnet 100, 200,..., 500. For the economical reason the ferrite magnet 14 is used for the remaining part of each ring magnet. The cost of each ring magnet becomes higher as the proportion of the rare earth alloy magnet 12 to the ferrite magnet 14 is increased, whereas the volume of the ferrite magnet 14 must be increased as the proportion of the rare earth alloy magnet 12 is decreased. Therefore, the rare earth alloy magnet 12 is used to such an extent that the gross weight of each ring magnet does not unduly increase.

The rare earth alloy magnet 12 can be selected from known rare earth alloy magnets. A preferred example is Nd-Fe-B magnet composed of 10-30 mol % of Nd, 60-85 mol % of Fe and 2-25 mol % of B.

In each ring magnet 100, 200,..., 500 the sixteen trapezoidal segments (e.g. 101 to 116 in ring magnet 100) are dissimilar in height (i.e. length in the direction radially of the ring magnet). For each segment an optimum height can be determined according to the intended intensity of magnetization of that segment by using the mathematical programming method. As can be seen in FIG. 2 the ring magnets 100 and 500 at the opposite ends of the cylindrical apparatus 10 need to be relatively large in outer diameters and hence in volume. Since these ring magnets 100, 500 are distant from the aforementioned central region 16 where a very uniform magnetic field is to be produced, the magnetic influence of a unit volume of these magnets 100, 500 on the central region 16 is relatively weak, and accordingly the magnets 100, 500 must have a relatively large volume.

Figure 3:
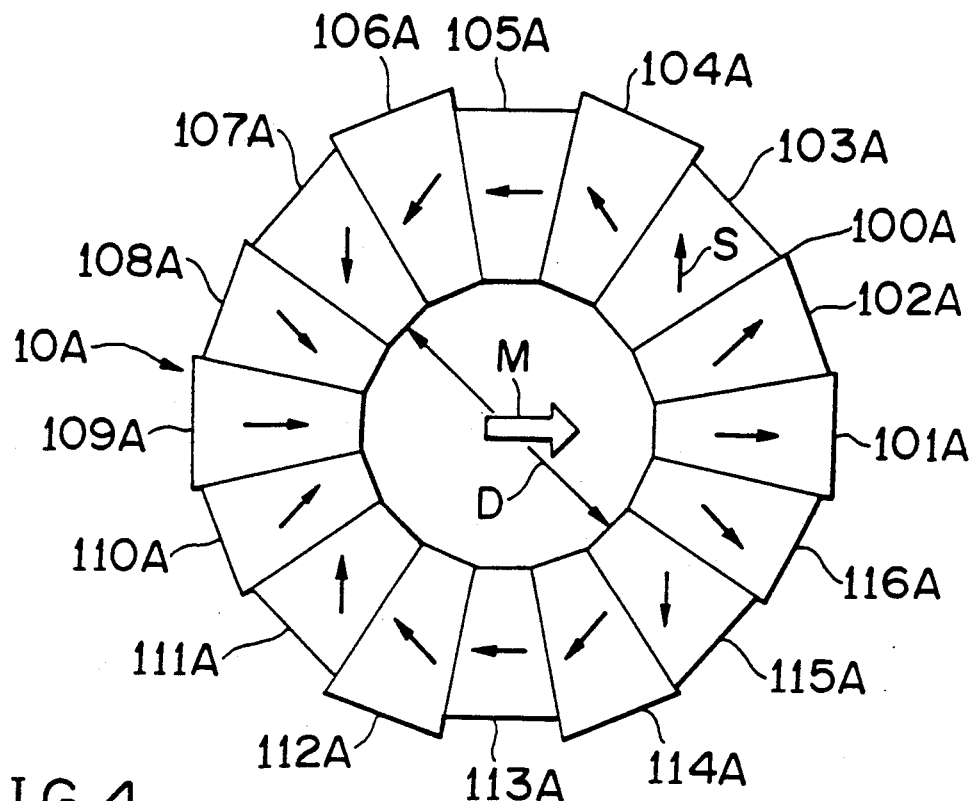
FIG. 3 is a front view of a conventional magnet apparatus.
Figure 4:
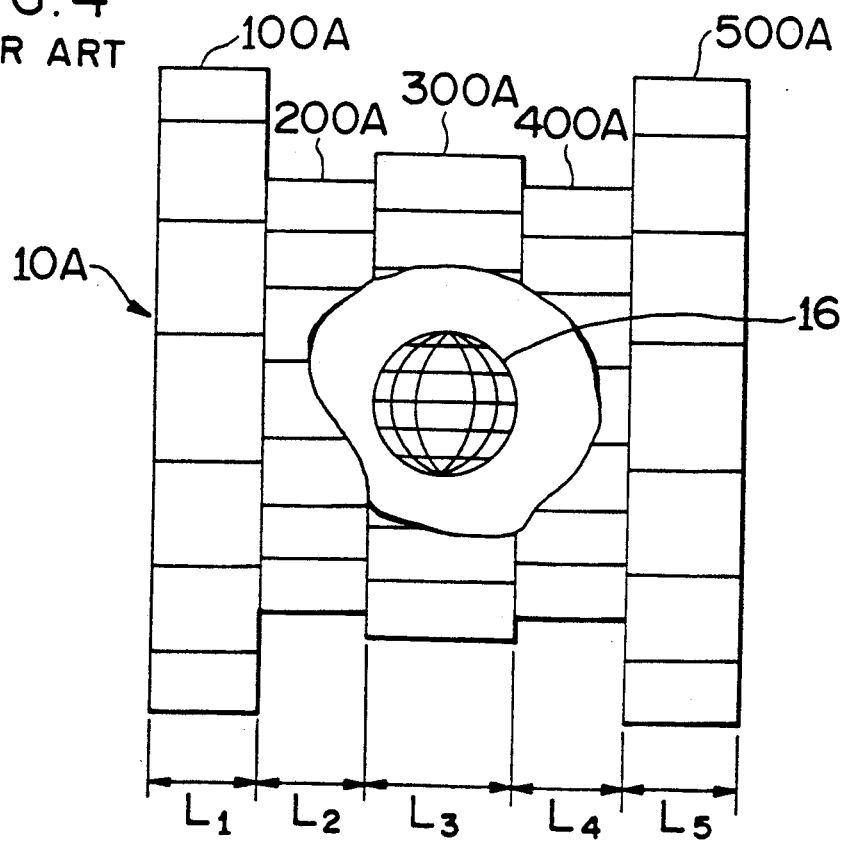
FIG. 4 is a side elevational view of the apparatus of FIG. 3.

FIGS. 3 and 4 show a conventional magnetic field producing apparatus 10A which is fundamentally similar to the apparatus 10 shown in FIGS. 1 and 2. That is, this apparatus 10A is an assembly of five dipole ring magnets 100A, 200A, 300A, 400A, 500A, and each ring magnet is constructed of sixteen cross-sectionally trapezoidal segments, such as segments 101A, 102A,..., 116A of the ring magnet 100A, each of which is an anisotropic magnet block. However, in this apparatus 10A every segment of each ring magnet is entirely made of a ferrite magnet. Therefore, compared with the ring magnets 100, 200,..., 500 in FIG. 2 the ring magnets 100A, 200A,..., 500A in FIG. 4 need to be made larger in outer diameters. In particular the ring magnets 100A and 500A at the two ends of the apparatus 10A need to be made very larger in outer diameters.

In an example of the apparatus 10A in FIGS. 3 and 4 the inner diameter D was 800 mm, and the axial lengths of the respective ring magnets 200A, 200A,..., 500A were as follows.

$L_1 = L_2 = L_4 = L_5 = 300$ mm
$L_3 = 400$ mm

In the example the ferrite magnet was of the following characteristics.

Residual magnetic flux density, $B_r$: 0.4 kG
Maximum energy product, $(BH)_{max}$: 3.8 MGOe
Specific gravity: 5

Assuming that the central region 16 in the apparatus is a spherical region having a diamter of 400 mm and that a uniform magnetic field of 2000 gauss is to be produced in the central region 16, the total weight of the ferrite magnet for constructing the apparatus 10A amounted to 12300 kg.

For comparison, another example of the apparatus 10A of FIGS. 3 and 4 was constructed by using a rare earth alloy magnet, viz. Nd-Fe-B magnet of the following characteristics, as the sole magnet material for the entirety of the ring magnets 100A, 200A,..., 500A.

Residual magnetic flux density, $B_r$: 1.6 kG
Maximum energy product, $(BH)_{max}$: 32.0 MGOe
Specific gravity: 7.4

The inner diameter D of the apparatus 10A and the lengths L1, L2, L3, L4, L5 of the respective ring magnets were the same as in the example using the ferrite magnet. In this case the ring magnets 100A, 200A,..., 500A could be reduced in outer diameters, and for producing a uniform field of 2000 G in the central region 16 the total weight of the Nd-Fe-B magnet became 2850 kg, which was only about 23% of the weight of the ferrite magnet used in the former example. However, the price of the rare earth alloy magnet is about 10 times the price of the ferrite magnet per unit weight, so that cost of the example using the rare earth alloy magnet became about 2.3 times the cost of the example using the ferrite magnet.

In an example of the apparatus 10 of FIGS. 1 and 2 the inner diameter D of the apparatus was 800 mm, and the lengths $L_1$, $L_2$, $L_3$, $L_4$ and $L_5$ of the respective ring magnets 100, 200,..., 500 were the same as in the examples of the apparatus 10A in FIGS. 3 and 4, viz. 300 mm, 300 mm, 400 mm, 300 mm and 300 mm, respectively. The ferrite magnet used in the first example of the apparatus of FIGS. 3 and 4 and the Nd-Fe-B magnet used in the second example were used also in this example. The ring magnets 100, 200,..., 500 were designed so as to realize a uniform field of 2000 G in the central spherical region 16 of the apparatus 10 having a diameter of 400 mm. As a result, compared with the second example of the apparatus of FIGS. 3 and 4 using the Nd-Fe-B magnet, about 33% reduction in the magnet material cost was achieved. The total weight of the ferrite magnet 14 and the Nd-Fe-B magnet 12 in FIGS. 1 and 2 amounted to about 3850 kg, which means that the cost reduction was accompanied by an increase in weight by about 1000 kg and that the increased weight was still far less than the weight (12300 kg) of the first exmple of the apparatus of FIGS. 3 and 4 using the ferrite magnet. The joint use of the ferrite magnet and the rare earth alloy magnet raised no problem in respect of the construction and performance of the apparatus 10.

Figure 5:
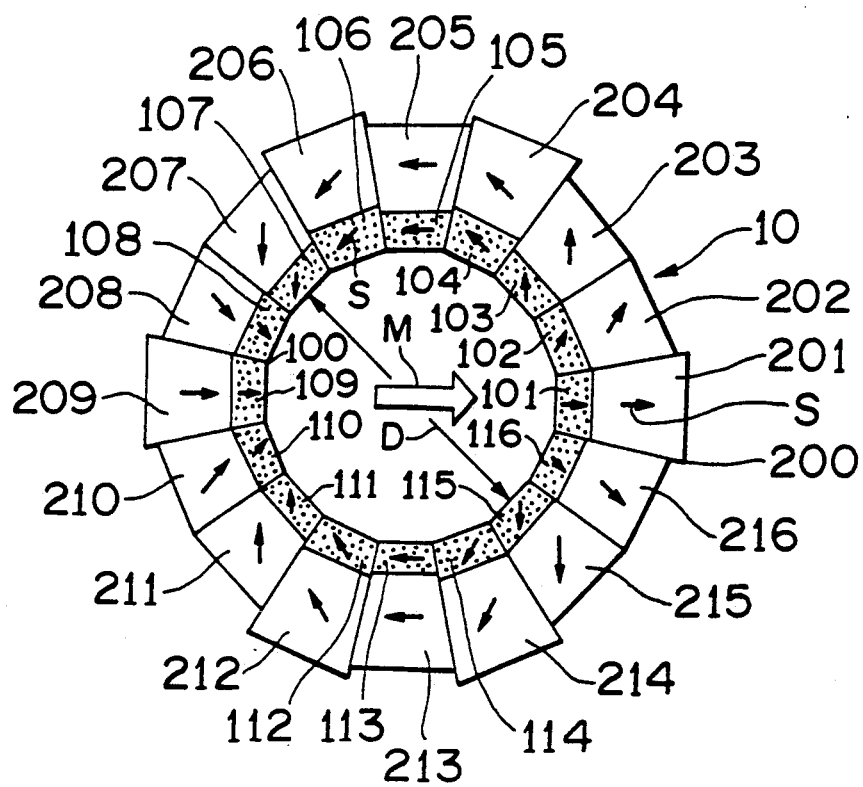
FIG. 5 is a front view of a magnet apparatus as another embodiment of the invention.
Figure 6:
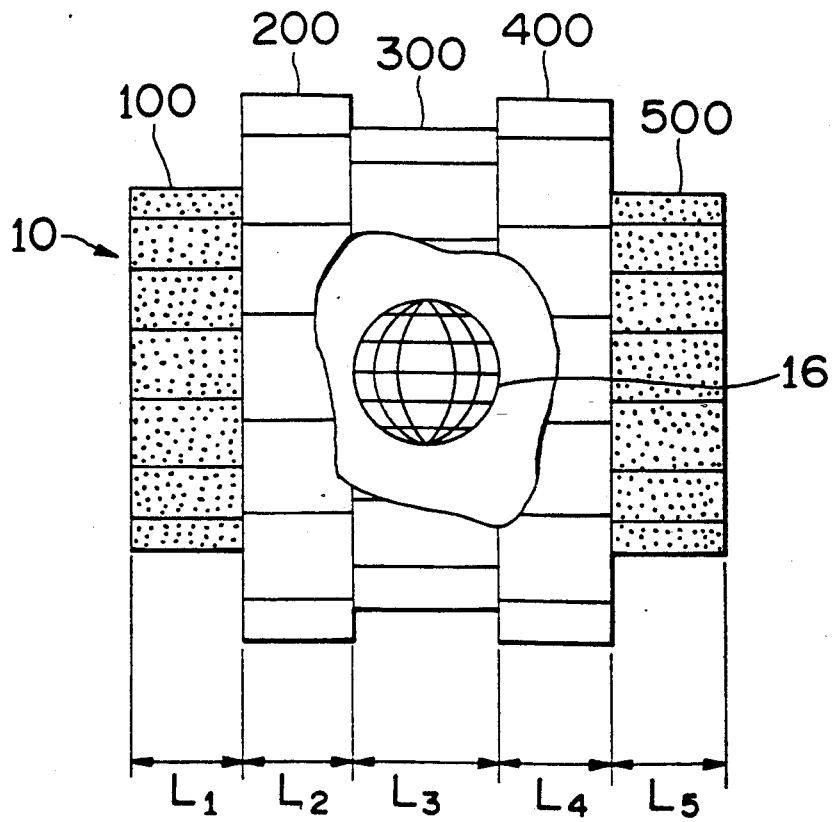
FIG. 6 is a side elevational view of the apparatus of FIG. 5.

FIGS. 5 and 6 show a second embodiment of the invention. In devising this embodiment, particular attention was paid to the very large outer diameters of the two ring magnets 100A and 500A at the two ends of the known apparatus 10A of FIGS. 3 and 4 using a ferrite magnet.

The apparatus 10 of FIGS. 5 and 6 also is a coaxial assembly of five dipole ring magnets 100, 200, 300, 400, 500, and each ring magnet is constructed of sixteen cross-sectionally trapezoidal segments, such as segments 101, 102,..., 116 of the ring magnet 100 and segments 201, 202,..., 216 of the ring magnet 200, each of which is an anisotropic magnet block. With respect to the ring magnet 100 at one end of the apparatus 10 and the ring magnet 500 at the opposite end, every segment of these two ring magnets 100, 500 is made of a rare earth alloy magnet. On the other hand, every segment of the remaining three ring magnets 200, 300, 400 is made of a ferrite magnet. Since a rare earth alloy magnet superior in magnetic characteristics is used, the two ring magnets 100 and 500 can be made considerably smaller in outer diameters compared with the counterparts (100A and 500A) in FIGS. 3 and 4.

In an example of the apparatus 10 of FIGS. 5 and 6 the inner diameter D of the apparatus was 800 mm, and the lengths $L_1$, $L_2$, $L_3$, $L_4$ and $L_5$ were the same as in the foregoing examples, viz. 300 mm, 300 mm, 400 mm, 300 mm and 300 mm, respectively. All the segments of the two ring magnets 100 and 500 were made of the Nd-Fe-B magnet used in the foregoing examples, and all the segments of the remaining three ring magnets 200, 300, 400 were made of the ferrite magnet used in the foregoing examples. The ring magnets 100, 200,..., 500 were respectively designed so as to realize a uniform field of 2000 G in the central spherical region 16 of the apparatus 10 having a diameter of 400 mm. It was possible to greatly decrease the outer diameters of the two ring magnets 100 and 500. The total weight of the five ring magnets became 7150 kg. That is, compared with the first example of the apparatus 10A of FIGS. 3 and 4 using the ferrite magnet alone, the gross weight of the apparatus decreased by more than 5000 kg. The use of the Nd-Fe-B magnet for the two ring magnets 100, 500 caused an about 40% increase in the magnet material cost, but the amount of the increase is very small by comparison with the case of using the rare earth alloy magnet for the entirety of the five ring magnets.

Figure 7:
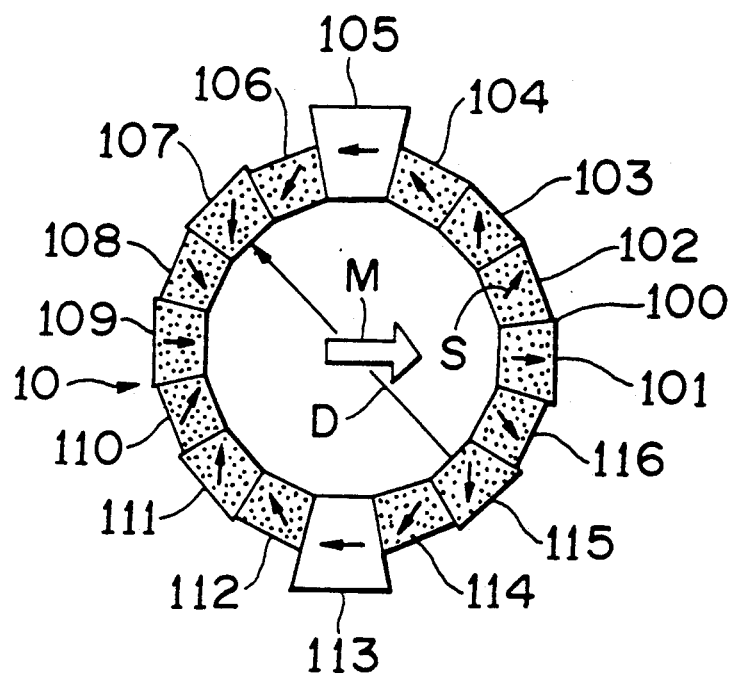
FIG. 7 is a front view of a magnet apparatus as a third embodiment of the invention.
Figure 8:
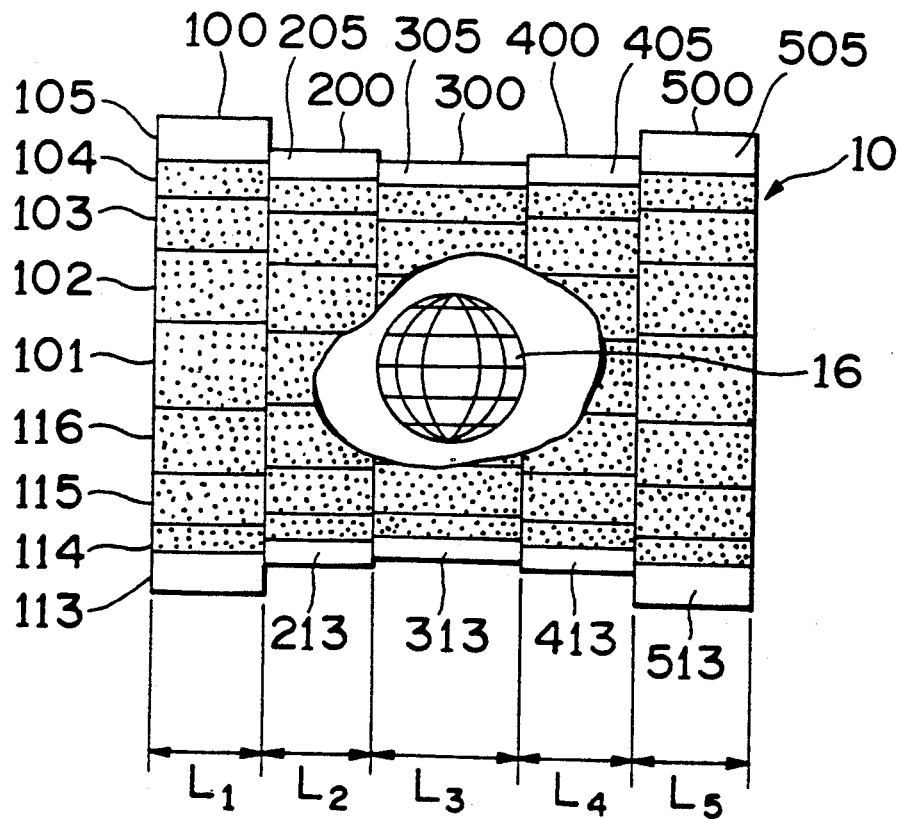
FIG. 8 is a side elevational view of the apparatus of FIG. 7.

FIGS. 7 and 8 show a third embodiment of the invention. This apparatus 10 also is a coaxial assembly of five dipole ring magnets 100, 200, 300, 400, 500, and each ring magnet is constructed of sixteen cross-sectionally trapezoidal segments, such as segments 101, 102,..., 116 of the ring magnet 100, each of which is an anisotropic magnet block.

In the ring magnet 100 at one end of the apparatus 10, the segment 105 and the segment 113 positioned opposite to the segment 105 are made of a ferrite magnet. As can be seen in FIG. 7, in these two segments 105 and 113 the direction of magnetization indicated by arrows S is parallel to the direction of a uniform magnetic field, indicated by arrow M, produced in the hole of the dipole ring magnet 100. The remaining fourteen segments of the ring magnet 100 are all made of a rare earth alloy magnet. The reason for using the inexpensive ferrite magnet only for the two specific segments 105 and 113 is that these two segments do not serve an important role in producing a uniform magnetic field in the ring magnet 100, and hence in the bore of the apparatus 10, because of the parallelness of the direction of magnetization S to the direction M of the uniform magnetic field.

Similarly, in each of the remaining ring magnets 200, 300, 400, 500, only two segments in which the direction of magnetization is parallel to the direction M of the magnetic field in the apparatus are made of the ferrite magnet, whereas the remaining segments are made of the rare earth alloy magnet. In FIG. 8, segments 205 and 213 of the ring magnet 200, segments 305 and 313 of the ring magnet 300, segments 405 and 413 of the ring magnet 400 and segments 505 and 513 of the ring magnet 500 are made of the ferrite magnet.

Compared with the case of using the rare earth alloy magnet for every segment of each ring magnet the apparatus of FIGS. 7 and 8 is considerably reduced in material cost although a slight increase in weight accompanies.

In the above described embodiments five dipole ring magnets are used to construct an apparatus according to the invention, but this is not limitative. The number of the ring magnets can be increased or decreased. However, always an odd number of ring magnets should be used since it is intended to produce a uniform magnetic field in an central region of the cylindrical hole in the apparatus. In the case of using an even number of ring magnets axially end regions of two adjacent ring magnets surround a central region of the cylindrical hole, and this is unfavorable for uniformity of the magnetic field produced in the central region.

To produce a uniform magnetic field in the cylindrical hole in the apparatus it is desirable that the magnetic circuits of each dipole ring magnet are symmetrical with respect to the center axis of the ring magnet. Therefore, each dipole ring magnet should be constructed of an even number of cross-sectionally trapezoidal segments each of which is an anisotropic magnet block. The even number of segments are designed and arranged such that the inner circumference of the ring magnet is divided into equal n parts (n is the number of the segments) and such that every two segments positioned opposite to each other (with respect to the center axis of the ring magnet) are symmetrical in shape and identical in dimensions including the height (length in the direction radially of the ring magnet). In each ring magnet the minimum number of the segments will be four, but usually a larger number of segments are used by dividing each of the four segments into two halves and, according to the need, further halving the respective halves. In other words, it is preferable that in each ring magnet the number of segments is a multiple of 8, such as 8, 16 or 32. For uniformity of a magnetic field produced in the hole of each dipole ring magnet it is favorable to increase the number of segments (anisotropic magnet blocks), but the magnetic circuits become intricate as the number of segments is increased. In the practice of the invention it suffices divide each ring magnet into 32 segments at the maximum.

What is claimed is:

1. A cylindrical magnet apparatus suitable for use in NMR imaging, the apparatus having an assembly of a plurality of dipole ring magnets having substantially the same inner diameter in a coaxially juxtaposed arrangement, each of the dipole ring magnets being constructed of a plurality of segments which are arranged annularly, each of the segments being an anisotropic magnet block with has a trapezoidal cross-sectional shape and is magnetized in a suitable direction before constructing the dipole ring magnet such that a magnetic field in a predetermined direction is produced in the hole of each dipole ring magnet, characterized in that in each of said segments of each of said dipole ring magnets an end part on the radially inner side of the ring magnet is made of a rare earth alloy magnet whereas the remaining part of the segment is made of a ferrite magnet.

2. An apparatus according to claim 1, wherein said segments of each of said dipole ring magnets are dissimilar in length in the direction radially of the ring magnet, the length of each segment being determined according to the intensity of magnetization of the segment.

3. An apparatus according to claim 1, wherein the number of said segments of each of said dipole ring magnets is an even number, in each of said dipole ring magnets every two segments opposite to each other with respect to the center axis of the ring magnet are symmetrical in shape and have the same length in the direction radially of the ring magnet.

4. An apparatus according to claim 3, wherein said even number is a multiple of 8.

5. An apparatus according to claim 4, wherein said even number is not greater than 32.

6. An apparatus according to claim 1, wherein the number of said dipole ring magnets is an odd number.

7. An apparatus according to claim 1, wherein said rare earth alloy magnet is a Nd-Fe-B magnet.

8. A cylindrical magnet apparatus suitable for use in NMR imaging, the apparatus having an assembly of at least three dipole ring magnets having substantially the same inner diameter in a coaxially juxtaposed arrangement, each of the dipole ring magnets being constructed of a plurality of segments which are arranged annularly, each of the segments being an anisotropic magnet block which has a trapezoidal cross-sectional shape and is magnetized in a suitable direction before constructing the dipole ring magnet such that a magnetic field in a predetermined direction is produced in the hole of each dipole ring magnet, characterized in that in one of said dipole ring magnets which is positioned at one end of said assembly and in another of said dipole ring magnets which is positioned at the opposite end of said assembly each of said segments is made of a rare earth alloy magnet whereas in each of the remaining dipole ring magnets each of said segments is made of a ferrite magnet.

9. An apparatus according to claim 8, wherein said segments of each of said dipole ring magnets are dissimilar in length in the direction radially of the ring magnet, the length of each segment being determined according to the intensity of magnetization of the segment.

10. An apparatus according to claim 8, wherein the number of said segments of each of said dipole ring magnets is an even number, in each of said dipole ring magnets every two segments opposite to each other with respect to the center axis of the ring magnet are symmetrical in shape and have the same length in the direction radially of the ring magnet.

11. An apparatus according to claim 10, wherein said even number is a multiple of 8.

12. An apparatus according to claim 11, wherein said even number is not greater than 32.

13. An apparatus according to claim 8, wherein the number of said dipole ring magnets is an odd number.

14. An apparatus according to claim 8, wherein said rare earth alloy magnet is a Nd-Fe-B magnet.

15. A cylindrical magnet apparatus suitable for use in NMR imaging, the apparatus having an assembly of a plurality of dipole ring magnets having substantially the same inner diameter in a coaxially juxtaposed arrangement, each of the dipole ring magnets being constructed of a plurality of segments which are arranged annularly, each of the segments being an anisotropic magnet block which has a trapezoidal cross-sectional shape and is magnetized in a suitable direction before constructing the dipole ring magnet such that a magnetic field in a predetermined direction is produced in the hole of each dipole ring magnet, characterized in that among said segments of each of said dipole ring magnets only two segments in which the direction of magnetization is parallel to said predetermined direction of the magnetic field produced in the hole of each dipole ring magnet are made of a ferrite magnet whereas the remaining segments are made of a rare earth alloy magnet.

16. An apparatus according to claim 15, wherein said segments of each of said dipole ring magnets are dissimilar in length in the direction radially of the ring magnet, the length of each segment being determined according to the intensity of magnetization of the segment.

17. An apparatus according to claim 15, wherein the number of said segments of each of said dipole ring magnets is an even number, in each of said dipole ring magnets every two segments opposite to each other with respect to the center axis of the ring magnet are symmetrical in shape and have the same length in the direction radially of the ring magnet.

18. An apparatus according to claim 17, wherein said even number is a multiple of 8.

19. An apparatus according to claim 18, wherein said even number is not greater than 32.

20. An apparatus according to claim 15, wherein the number of said dipole ring magnets is an odd number.

21. An apparatus according to claim 15, wherein said rare earth alloy magnet is a Nd-Fe-B magnet.

* * * * *